United States Patent
Liaw et al.

(10) Patent No.: US 7,869,253 B2
(45) Date of Patent: Jan. 11, 2011

(54) METHOD OF DETERMINING A MEMORY STATE OF A RESISTIVE MEMORY CELL AND DEVICE MEASURING THE MEMORY STATE OF A RESISTIVE MEMORY CELL

(75) Inventors: Corvin Liaw, Munich (DE); Michael Angerbauer, Freutsmoos (DE); Heinz Hoenigschmid, Poecking (DE)

(73) Assignee: Qimonda AG, Munich (DE)

( * ) Notice: Subject to any disclaimer, the term of this patent is extended or adjusted under 35 U.S.C. 154(b) by 102 days.

(21) Appl. No.: 11/507,362

(22) Filed: Aug. 21, 2006

(65) Prior Publication Data

US 2008/0043521 A1 Feb. 21, 2008

(51) Int. Cl.
*G11C 11/00* (2006.01)
*G11C 11/14* (2006.01)

(52) U.S. Cl. ............... 365/148; 365/158; 365/163; 365/171; 365/173

(58) Field of Classification Search ............... 365/100, 365/148, 158, 171, 173, 163
See application file for complete search history.

(56) References Cited

U.S. PATENT DOCUMENTS

| | | | |
|---|---|---|---|
| 5,761,115 A | 6/1998 | Kozicki et al. | |
| 6,813,176 B2 * | 11/2004 | Gilton et al. | 365/148 |
| 6,873,540 B2 * | 3/2005 | Krieger et al. | 365/148 |
| 6,950,331 B2 * | 9/2005 | Yang et al. | 365/148 |
| 7,215,568 B2 * | 5/2007 | Liaw et al. | 365/148 |
| 7,233,515 B2 * | 6/2007 | Rohr | 365/148 |
| 7,254,052 B2 * | 8/2007 | Liaw | 365/148 |
| 7,257,013 B2 * | 8/2007 | Roehr | 365/148 |
| 7,388,775 B2 * | 6/2008 | Bedeschi et al. | 365/163 |
| 2003/0156463 A1 | 8/2003 | Casper et al. | |
| 2005/0146958 A1 | 7/2005 | Moore et al. | |
| 2005/0250281 A1 * | 11/2005 | Ufert et al. | |
| 2006/0062062 A1 | 3/2006 | Baker | |
| 2006/0067147 A1 | 3/2006 | Roehr | |

FOREIGN PATENT DOCUMENTS

| | | |
|---|---|---|
| JP | 2000512058 A | 9/2000 |
| JP | 2000293993 A | 10/2000 |
| WO | 2005041204 A1 | 5/2005 |

OTHER PUBLICATIONS

The corresponding Japanese Office Action mailed May 11, 2010.
Abstract for JP 2000-293993 A.

* cited by examiner

*Primary Examiner*—Trong Phan

(57) ABSTRACT

A method of determining the memory state of a resistive memory cell including a first electrode, a second electrode and an active material being arranged between the first electrode and the second electrode, comprises generating a read capacity by applying a voltage between the first electrode and the second electrode, discharging the read capacity over the active material of the memory cell, and determining the memory state of the memory cell in dependence on a change of the voltage during the discharge of the read capacity.

14 Claims, 8 Drawing Sheets

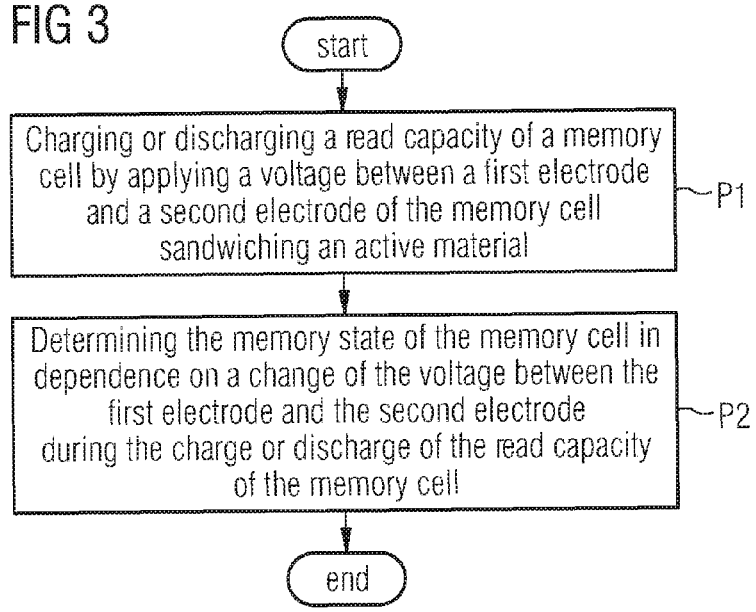
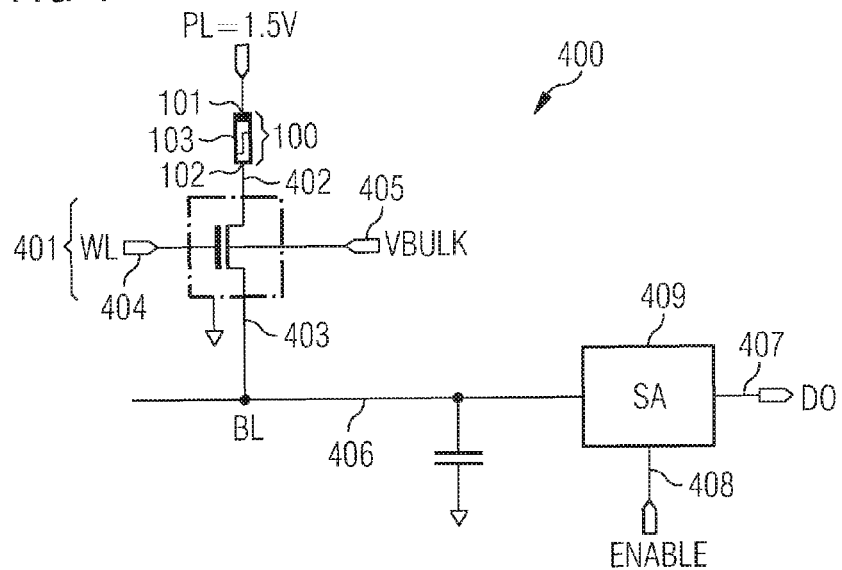

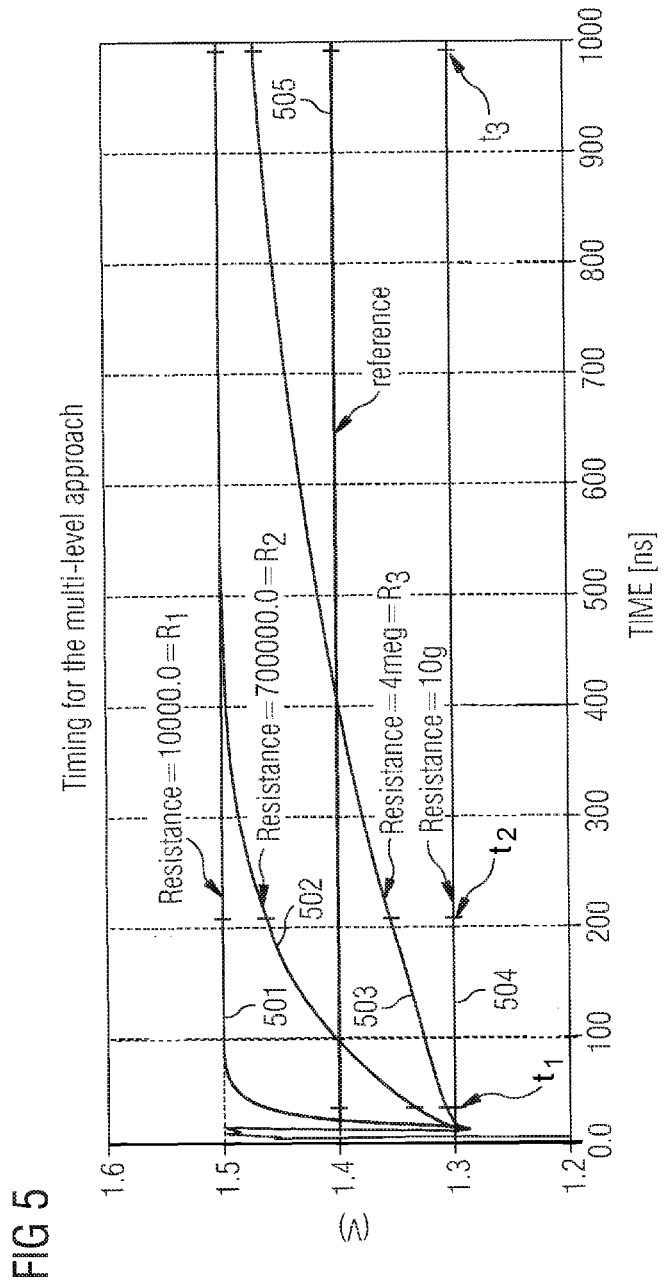

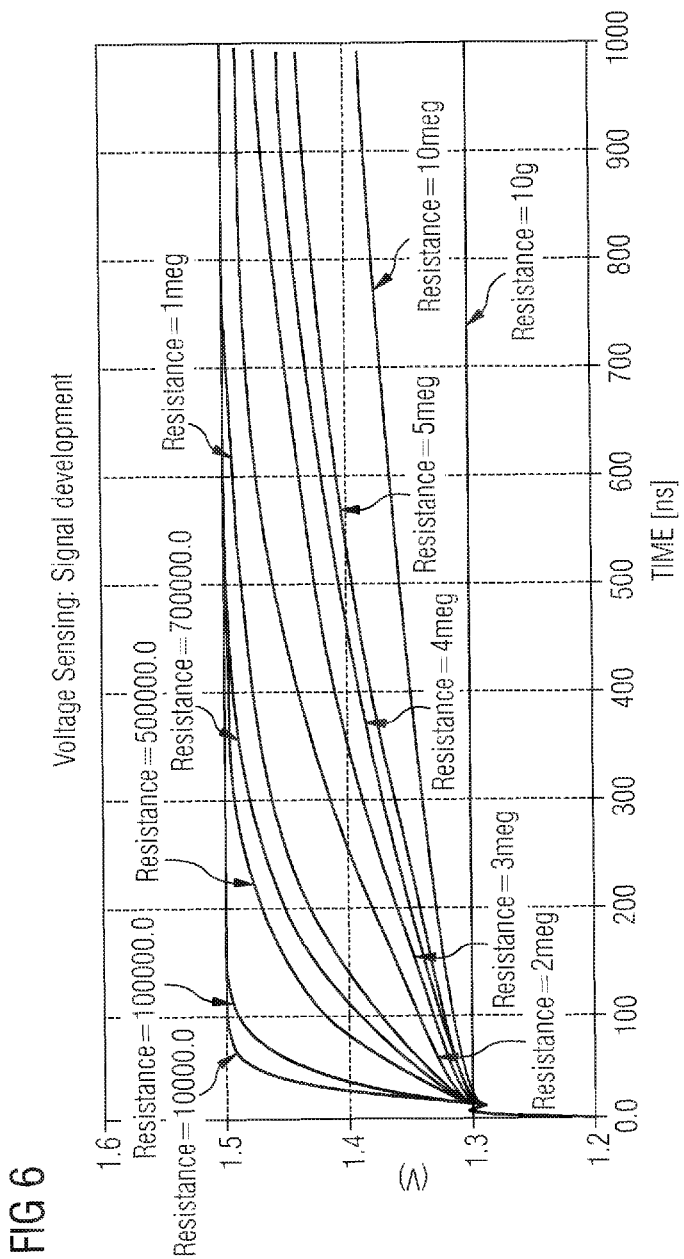

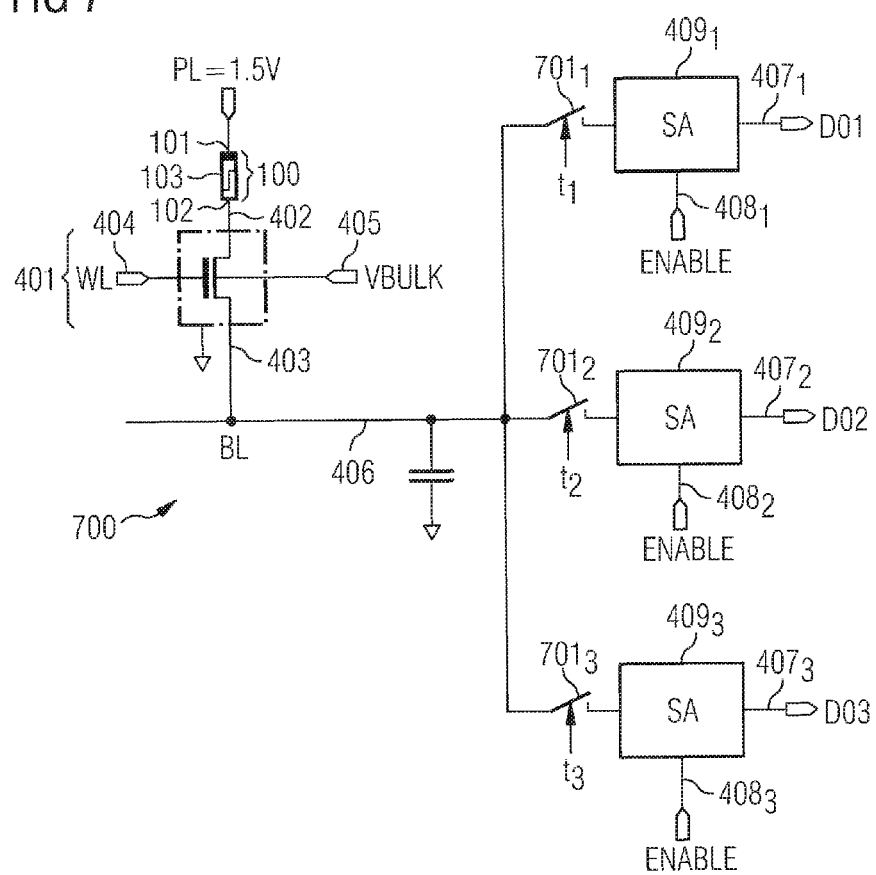

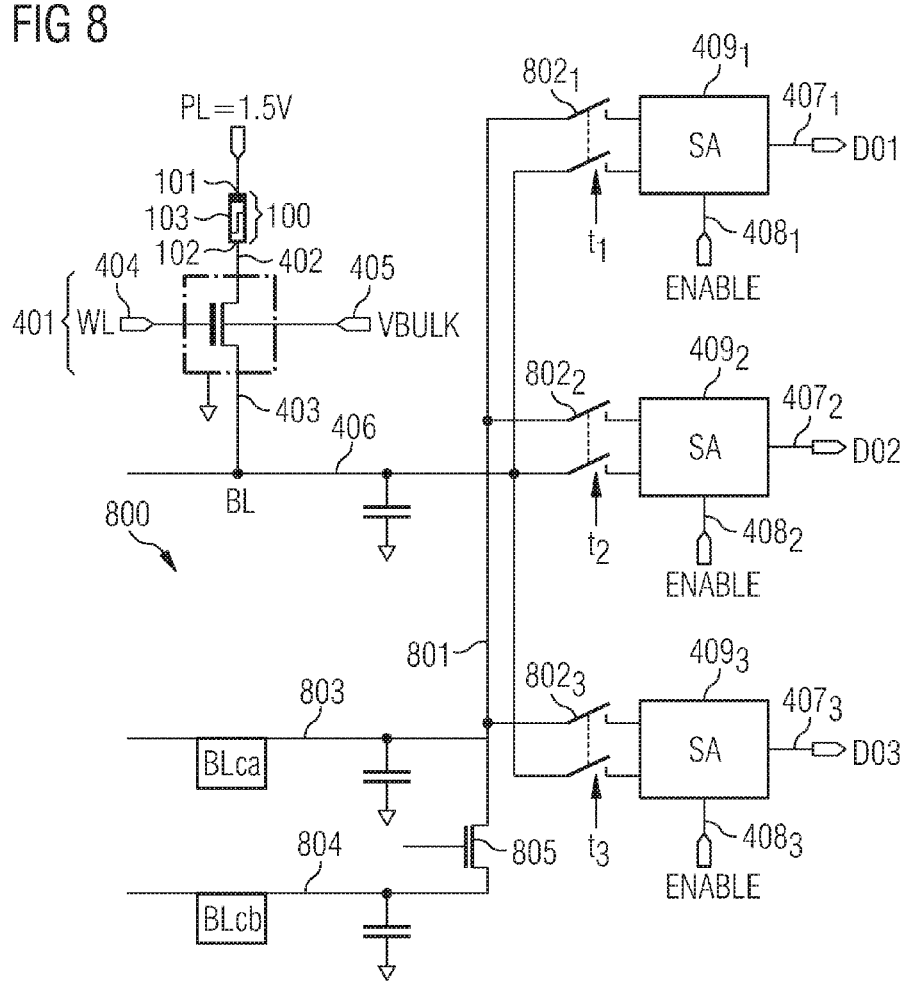

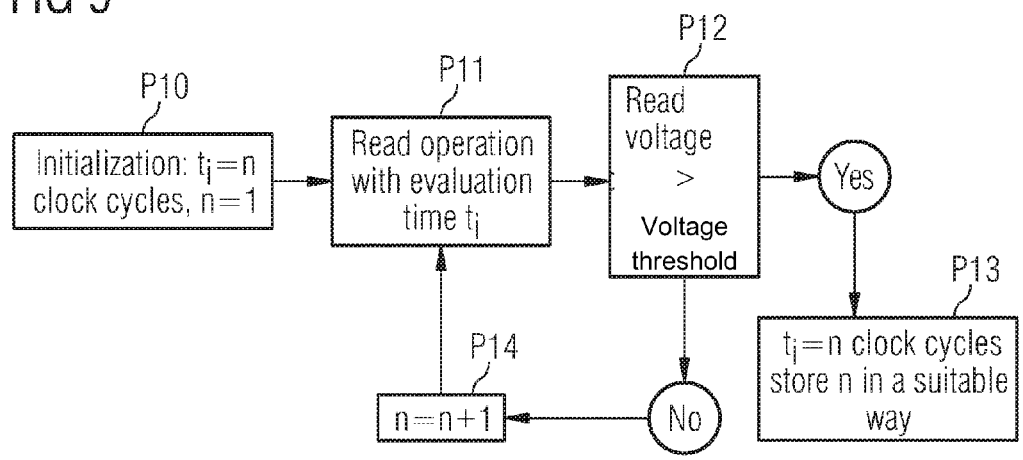

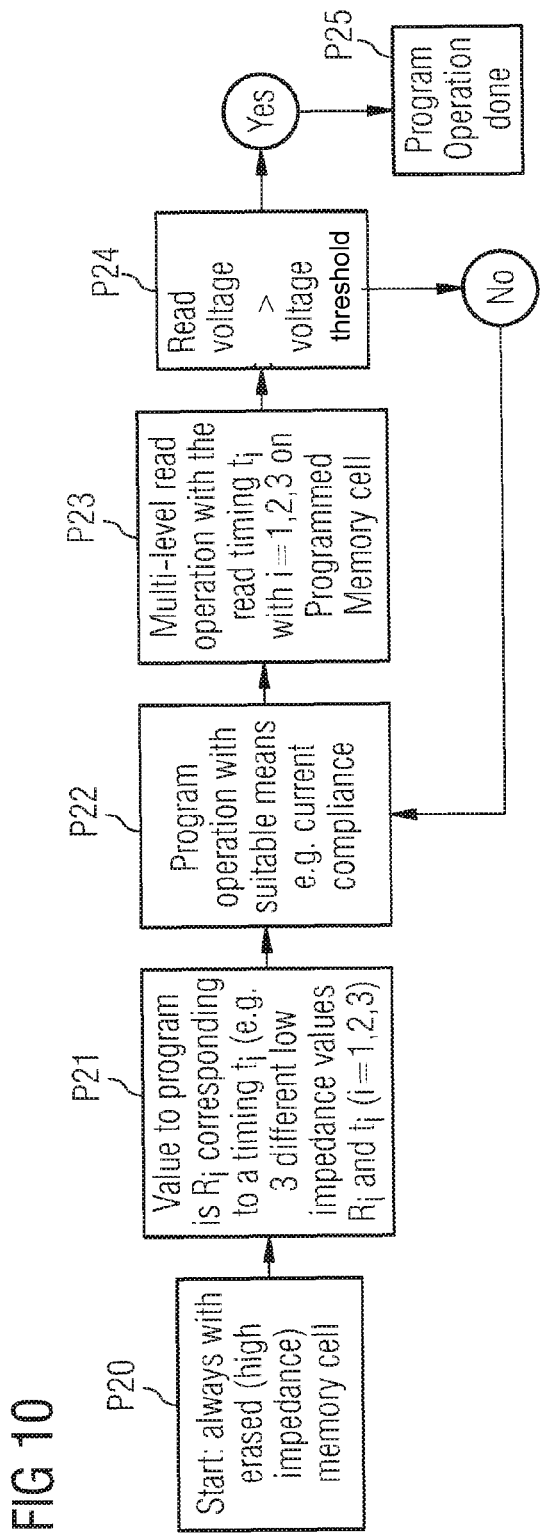

METHOD OF DETERMINING A MEMORY STATE OF A RESISTIVE MEMORY CELL AND DEVICE MEASURING THE MEMORY STATE OF A RESISTIVE MEMORY CELL

TECHNICAL FIELD

The invention relates to a method of determining the memory state of a resistive memory cell and a device measuring the memory state of a resistive memory cell.

BACKGROUND

Semiconductor devices are used for integrated circuits in a variety of electrical and electronic applications, such as computers, cellular telephones, radios, and televisions. One particular type of semiconductor device is a semiconductor storage device, such as a random access memory (RAM) device. RAM devices use an electrical charge to store information. Many RAM devices include many storage cells arranged in a two-dimensional array with two sets of select lines, wordlines and bitlines. An individual storage cell is selected by activating its wordline and its bitline. RAM devices are considered "random access" because any memory cell in an array can be accessed directly if the row and column that intersect at that cell are known.

A commonly used form of RAM is known as a dynamic RAM device. Dynamic random access memory (DRAM) has memory cells with a paired transistor and capacitor. As a dynamic memory, the DRAM must be refreshed to retain its information. A static random access memory (SRAM), which may include six transistors, will retain its state as long as power remains to the device. To retain memory even without power a non-volatile memory must be used. Examples of non-volatile memories include conductive bridging random access memory (CBRAM), magnetoresistive random access memory (MRAM), and plated chalcogenide random access memory (PCRAM).

It is desirable to improve a memory density of resistive memory cells.

SUMMARY OF THE INVENTION

According to one embodiment of the present invention a method of determining the memory state of a resistive memory cell is provided, the memory cell including a first electrode, a second electrode and an active material being arranged between the first electrode and the second electrode, including charging or discharging a read capacity of the memory cell by applying a voltage between the first electrode and the second electrode, and determining the memory state of the memory cell in dependence on a change of the voltage during the charge or discharge of the read capacity.

BRIEF DESCRIPTION OF THE DRAWINGS

For a more complete understanding of exemplary embodiments of the present invention and the advantages thereof, reference is no made to the following description taken in conjunction with the accompanying drawings, in which:

FIG. 3 shows a flow chart of one embodiment of the method according to the present invention;

FIG. 4 shows a schematic drawing of one embodiment of the memory device according to the present invention;

FIG. 5 shows a voltage diagram characterizing different read capacity discharging processes occurring within embodiments of the method according to the present invention;

FIG. 6 shows a voltage diagram characterizing different read capacity discharging processes occurring within embodiments of the method according to the present invention;

FIG. 7 shows a schematic drawing of one embodiment of the memory device according to the present invention;

FIG. 8 shows a schematic drawing of one embodiment of the memory device according to the present invention;

FIG. 9 shows a flow chart of one embodiment of the method of reading the memory state of a resistive memory cell according to the present invention; and FIG. 10 shows a flow chart of one embodiment of the method of programming the memory state of a resistive memory cell according to the present invention.

DETAILED DESCRIPTION OF ILLUSTRATIVE EMBODIMENTS

Figure 1A:
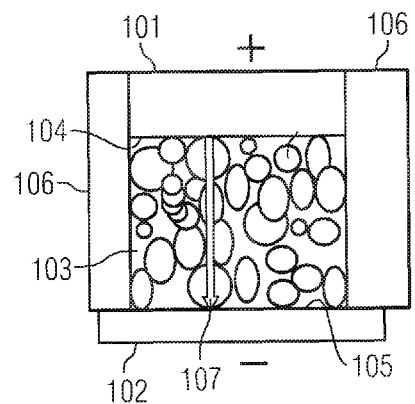
FIG. 1A shows a schematic cross-sectional view of a solid electrolyte memory cell set to a first switching state.

According to one embodiment of the present invention, a method of determining the memory state of a resistive memory cell is provided, the memory cell including a first electrode, a second electrode and an active material being arranged between the first electrode and the second electrode, including charging or discharging a read capacity of the memory cell (via the active material of the memory cell) by applying a voltage between the first electrode and the second electrode, and determining the memory state of the memory cell in dependence on a change of the voltage during the charge or discharge of the read capacity.

According to one embodiment of the present invention, the voltage of the first electrode is kept constant during the charge or discharge of the read capacity.

According to one embodiment of the present invention, the voltage of the second electrode performs an adaptation process during the charge or discharge of the read capacity, the adaptation process adapting the voltage of the second electrode to the voltage of the first electrode.

According to one embodiment of the present invention, the memory state is determined in dependence on characteristics of the adaptation process.

According to one embodiment of the present invention, the determining of the memory state is carried out by sampling the voltage of the second electrode, wherein corresponding voltage sampling values are compared with a reference voltage.

According to one embodiment of the present invention, the sampling is carried out at time instances in which the difference between the voltage of the second electrode and the at least one reference voltage is larger than a predetermined voltage threshold value.

According to one embodiment of the present invention, a voltage adaptation function is assigned to each possible memory state of the memory cell, each voltage adaptation function reflecting a respective adjusting process of the voltage of the second electrode to the voltage of the first electrode, and at least one sampling time is assigned to each voltage adaptation function, the at least one sampling time being chosen such that the difference between the voltage adaptation function and the at least one reference voltage is larger than a predetermined voltage threshold value.

According to one embodiment of the present invention, the voltage adaptation function reflecting the charge or discharge of the read capacity is determined by sampling the voltage of the second electrode at sampling times that are assigned to possible voltage adaptation functions and by processing corresponding sampling values, and determining the memory state of the memory cell in dependence on the voltage adaptation function determined.

According to one embodiment of the present invention, the sampling times are chosen such that sampling times of voltage adaptation functions of memory states having a low resistance are older than sampling times of voltage adaptation functions of memory states having a high resistance.

According to one embodiment of the present invention, the at least one reference voltage is directly proportional to the supplying voltage of the memory cell or is directly proportional to the writing voltage of the memory cell.

According to one embodiment of the present invention, the sampling of the voltage of the second electrode is carried out using a sampling means being electrically connected to the second electrode via a bitline.

According to one embodiment of the present invention, the bitline is electrically disconnected from the sampling unit during the sampling process.

According to one embodiment of the present invention, the sampling of the voltage of the second electrode is carried out using a plurality of sampling units connected in parallel, each sampling unit being electrically connected to the second electrode via the bitline.

According to one embodiment of the present invention, wherein, at the beginning of the sampling process, all sampling units are electrically connected to the bitline, and wherein, at each sampling time, one of the sampling units is electrically disconnected from the bitline, the last sampling unit that has been electrically disconnected from the bitline carrying out the current sampling process.

According to one embodiment of the present invention, during the sampling process, supplying lines supplying the sampling units with the at least one reference voltage are electrically disconnected from the sampling units.

According to one embodiment of the present invention, the number of sampling units is n−1, wherein n is the number of possible memory states of the memory cell.

According to one embodiment of the present invention, the sampling times assigned to a voltage adaptation function is determined on the basis of the following processes:

a) charging or discharging a read capacity of a reference memory cell having a memory state corresponding to the voltage adaptation function by applying a voltage between the first electrode and the second electrode of the reference memory cell;

b) determining the change of the voltage during the charge or discharge of the reference memory cell by sampling the change of the voltage at at least one sampling time;

c) repeating the processes a) to b) using at least one other sampling time if the change of the voltage does not lie within a predetermined voltage target range.

According to one embodiment of the present invention, the sampling times are multiples of a clock cycle.

According to one embodiment of the present invention, the first sampling time is an early time instance of a charging process or discharging process, which is shifted towards later time instances of the charging process or discharging process if the change of the voltage at the first sampling time does not lie within a predetermined voltage target range.

According to one embodiment of the present invention, a method of programming a memory state of a resistive memory cell is provided, the memory cell including a first electrode, a second electrode and an active material being arranged between the first electrode and the second electrode, including the following processes:

a) programming the memory cell using a programming current or a programming voltage;

b) charging or discharging a read capacity of the memory cell by applying a voltage between the first electrode and the second electrode;

c) determining the change of the voltage during the charge or discharge of the read capacity; and d) repeating the processes a) to c) using a different programming current or a different programming voltage if the change of voltage does not lie within a predetermined voltage target range.

According to one embodiment of the present invention, a memory state determining device determining the memory state of a resistive memory cell is provided, the memory cell including a first electrode, a second electrode and an active material being arranged between the first electrode and the second electrode, the device including:

a voltage supplying unit generating a voltage between the first electrode and the second electrode; and a voltage determining unit determining a change of a voltage occurring during a charge or a discharge of a read capacity of the memory cell via the active material, the voltage change representing the memory state to be detected.

According to one embodiment of the present invention, the voltage supplying unit keeps the voltage of the first electrode constant during the charge or discharge of the read capacity.

According to one embodiment of the present invention, the second electrode is disconnectable from the voltage supplying unit during the charge or discharge of the read capacity such that the voltage of the second electrode becomes variable and can be adapted to the voltage of the first electrode.

According to one embodiment of the present invention, the voltage determining unit determines the voltage of the second electrode at different sampling times and compares corresponding voltage sampling values with at least one reference voltage in order to determine the memory state of the memory cell.

According to one embodiment of the present invention, the voltage determining unit samples the voltage of the second electrode at sampling times at which the difference between the voltage of the second electrode and the at least one reference voltage lies above a predetermined voltage threshold value.

According to one embodiment of the present invention, a voltage adaptation function is assigned to each possible memory state of the memory cell, each voltage adaptation function reflecting a respective adjusting process of the voltage of the second electrode to the voltage of the first electrode, and at least one sampling time is assigned to each voltage adaptation function, the at least one sampling time being chosen such that the difference between the voltage adaptation function and the at least one reference voltage is larger than a predetermined voltage threshold value.

According to one embodiment of the present invention, the voltage determining unit determines the voltage adaptation function reflecting the charge or discharge of the read capacity by sampling the voltage of the second electrode at sampling times which are assigned to possible voltage adaptation functions and by processing corresponding sampling values.

According to one embodiment of the present invention, a resistance value determining unit determines the memory state of the memory cell in dependence on the voltage adaptation function determined.

According to one embodiment of the present invention, the sampling times are chosen such that sampling times of voltage adaptation functions of memory states having a low resistance are older than sampling times of voltage adaptation functions of memory states having a high resistance.

According to one embodiment of the present invention, the voltage determining unit includes a sampling unit sampling the voltage of the second electrode, wherein the sampling unit is electrically connected to second electrode via a bitline.

According to one embodiment of the present invention, the bitline is electrically disconnectable from the sampling unit during the sampling process via a switching element.

According to one embodiment of the present invention, the voltage determining unit includes several sampling units connected in parallel, each sampling unit being electrically connected to the second electrode via the bitline and sampling the voltage of the second electrode.

According to one embodiment of the present invention, at the beginning of the sampling process, all sampling units are electrically connected to the bitline, and wherein, at each sampling time, one of the sampling units is electrically disconnected from the bitline via a switching element, the last sampling unit that has been electrically disconnected from the bitline carrying out the current sampling process.

According to one embodiment of the present invention, supplying lines supplying the sampling units with the at least one reference voltage are provided, the supplying lines being electrically disconnectable from the sampling units during the sampling process via switching elements.

According to one embodiment of the present invention, the number of sampling units is n−1, wherein n is the number of possible memory states of the memory cell.

According to one embodiment of the present invention, a sampling time determining means coordinating an iterative process is provided in order to determine the sampling times being assigned to a voltage adaptation function, the iterative process including:

a) charging or discharging a read capacity within a reference memory cell, the memory state of which corresponding to the voltage adaptation function, by applying a voltage between the first electrode and the second electrode of the reference memory cell using the voltage supplying unit;

b) determining the change of the voltage during the charge or discharge of the reference read capacity by sampling the change of the voltage at at least one sampling time using the voltage determining means, wherein the sampling time determining unit carries out processes a) to b) using at least one different sampling time until the change of the voltage lies within a predetermined voltage target range.

According to one embodiment of the present invention, a device programming a memory state of a resistive memory cell is provided, the memory cell including a first electrode, a second electrode and an active material being arranged between the first electrode and second electrode, including a voltage supplying unit generating a voltage between the first electrode and the second electrode, a voltage determining unit determining a change of the voltage occurring during the charge or discharge of a read capacity of the memory cell via the active material, wherein the voltage determining unit determines the memory state in dependence on the change of the voltage, and a programming unit iteratively programming the memory cell using programming currents or programming voltages until the corresponding change of the voltage lies within a predetermined voltage target range.

According to one embodiment of the present invention, a memory device is provided including at least one resistive memory cell including a first electrode, a second electrode and an active material being arranged between the first electrode and the second electrode, the memory device further including at least one device for determining the memory state of at least one resistive memory cell, including a voltage supplying unit generating a voltage between the first electrode and the second electrode, and a voltage determining unit determining a change of a voltage occurring during a charge or a discharge of a read capacity of the memory cell via the active material, the voltage change representing the memory state to be detected.

According to one embodiment of the present invention, a computer program product is provided being configured to carry out, when being executed on a computing device or a DSP, a method of determining the memory state of a resistant memory cell including a first electrode, a second electrode and an active material being arranged between the first electrode and the second electrode, including charging or discharging a read capacity of the memory cell by applying a voltage between the first electrode and the second electrode, and determining the memory state of the memory cell in dependence on a change of the voltage during the charge or discharge of the read capacity.

According to one embodiment of the present invention, a computer program product is provided being configured to carry out, when being executed on a computing device or a DSP, a method of programming a memory state of a resistive memory cell including a first electrode, a second electrode and an active material being arranged between the first electrode and the second electrode, including the following processes:

a) programming the memory cell using a programming current or a programming voltage;

b) charging or discharging a read capacity of the memory cell by applying a voltage between the first electrode and the second electrode;

c) determining the change of the voltage during the charge or discharge of the read capacity; and d) repeating the processes a) to c) using a different programming current or a different programming voltage if the change of voltage does not lie within a predetermined voltage target range.

According to one embodiment of the present invention, a data carrier storing a computer program product as described above is provided.

Since the embodiments of the present invention can be applied to solid electrolyte devices like CBRAM (conductive bridging random access memory) devices, in the following description, making reference to FIGS. 1a and 1b, a basic principle underlying CBRAM devices will be explained. Of course, the embodiments of the present invention can also be applied to other types of resistive memory devices like PCRAM (phase changing random access memory) devices or ORAM (organic random access memory) devices.

Figure 1B:
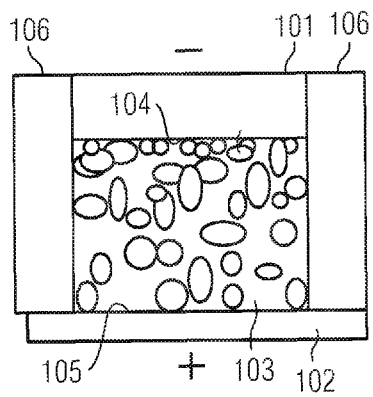
FIG. 1B shows a schematic cross-sectional view of a solid electrolyte memory cell set to a second switching state.

As shown in FIG. 1a, a CBRAM cell includes a first electrode 101 a second electrode 102, and a solid electrolyte block (in the following also referred to as ion conductor block) 103 which is the active material and which is sandwiched between the first electrode 101 and the second electrode 102. The first electrode 101 contacts a first surface 104 of the ion conductor block 103, the second electrode 102 contacts a second surface 105 of the ion conductor block 103. The ion conductor block 103 is isolated against its environment by an isolation structure 106. The first surface 104 usually is the top surface, the second surface 105 the bottom surface of the ion conductor 103. In the same way, the first electrode 101 generally is the top electrode, and the second electrode 102 the bottom electrode of the CBRAM cell. One of the first electrode 101 and the second electrode 102 is a reactive electrode, the other one an inert electrode. Here, the first electrode 101 is the reactive electrode, and the second electrode 102 is the inert electrode. In this example, the first electrode 101 includes silver (Ag), the ion conductor block 103 includes silver-doped chalcogenide material, and the isolation structure 106 includes $SiO_2$.

If a voltage as indicated in FIG. 1a is applied across the ion conductor block 103, a redox reaction is initiated which drives $Ag^+$ ions out of the first electrode 101 into the ion conductor block 103 where they are reduced to Ag, thereby forming Ag rich clusters within the ion conductor block 103. If the voltage applied across the ion conductor block 103 is applied for a long period of time, the size and the number of Ag rich clusters within the ion conductor block 103 is increased to such an extent that a conductive bridge 107 between the first electrode 101 and the second electrode 102 is formed. In case that a voltage is applied across the ion conductor 103 as shown in FIG. 1b (inverse voltage compared to the voltage applied in FIG. 1a), a redox reaction is initiated which drives $Ag^+$ ions out of the ion conductor block 103 into the first electrode 101 where they are reduced to Ag. As a consequence, the size and the number of Ag rich clusters within the ion conductor block 103 is reduced, thereby erasing the conductive bridge 107.

In order to determine the current memory status of a CBRAM cell, for example a sensing current is routed through the CBRAM cell. The sensing current experiences a high resistance in case no conductive bridge 107 exists within the CBRAM cell, and experiences a low resistance in case a conductive bridge 107 exists within the CBRAM cell. A high resistance may, for example, represent "0," whereas a low resistance represents "1," or vice versa. The memory status detection may also be carried out using sensing voltages, as described in the present invention.

Figure 2:
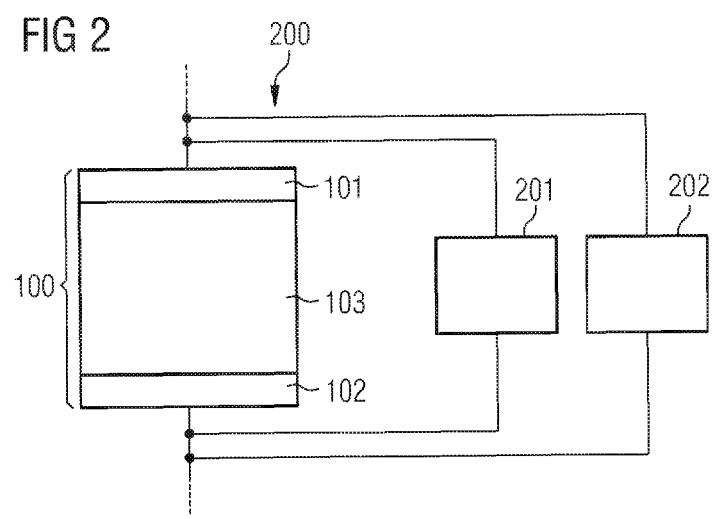
FIG. 2 shows a schematic block diagram of one embodiment of the memory state measuring device according to the present invention.

FIG. 2 shows an embodiment 200 of the memory state determining device according to the present invention. The device 200 serves for determining the memory state a resistive memory cell 100 including a first electrode 101, a second electrode 102 and an active material (for example a solid electrolyte block) 103 being arranged between the first electrode 101 and the second electrode 102. The device 200 includes a voltage supplying means 201 capable of generating a voltage between the first electrode 101 and the second electrode 102, and a voltage determining means 202 determining a change of voltage occurring during the charge or discharge of a read capacity of the memory cell 100 via the active material 103 of the memory cell 100, the change of voltage representing the memory state to be detected.

FIG. 3 shows one embodiment of the method of determining the memory state of a resistive memory cell according to the present invention. In a first process P1, a read capacity is charged or discharged over an active material arranged between a first electrode and a second electrode of a memory cell by applying a voltage between the first electrode and the second electrode. In a second process P2, the memory state of the memory cell is determined in dependence on a change of the voltage between the first electrode and the second electrode occurring during the charge or discharge of the read capacity.

FIG. 4 shows an embodiment 400 of the memory device according to the present invention. A memory device 400 includes a resistive memory cell 100 having a first electrode 101, a second electrode 102 and an active material 103 sandwiched between the first electrode 101 and the second electrode 102. The memory device 400 further includes a switching element 401 having a first input/output terminal 402, a second input/output terminal 403, a gate terminal 404 and a bulk terminal (VBULK) 405. The first input/output terminal 402 is electrically connected to the second electrode 102 of the resistive memory cell, and the second input/output terminal 403 is electrically connected to a bitline 406. The switching element 401 is controlled by the gate terminal 404 being electrically connected a wordline (not shown). The bitline 406 is electrically connected to a sense amplifier 409 having a digital output terminal (DO) 407 and a controlling terminal (ENABLE) 408. The sense amplifier 409 may include only voltage amplifying functionality (voltage amplifier) or also further functionality (for example latch functionality, sampling functionality, signal comparing functionality, etc.).

The working principle of the memory device 400 is as follows. The bitline is set to a voltage (preloading process) being smaller (or higher, see below) than the voltage of the first electrode 101, in this example 1.3 V. During the preloading process, the voltage of the gate terminal 404 is set to a value effecting that the switching element 401 is closed, i.e., the bitline 406 is electrically disconnected from the resistive memory cell 100. The voltage of the first electrode 102 is set to (or remains at) a constant voltage, in this example 1.5 V. Then, the gate terminal 404 is set to a voltage effecting that the switching element 401 opens, i.e., the resistive memory cell 100 is electrically connected to the bitline (BL) 406. At the same time or before, the bitline 406 is electrically disconnected from a preloading unit (not shown) responsible for the preloading process. Since the voltage of the first electrode 101 is kept at a constant value, the voltage of the bitline 406 is adapted to the voltage of the first electrode 101. The adaptation of the voltage of the bitline 406 to the voltage of the first electrode 101 results from the fact that the voltage difference between the first electrode 101 and the second electrode 102 charges a read capacity within the resistive memory cell 100, which is then discharged via the active material 103 of the resistive memory cell 100. The voltage adaptation process is detected and amplified by the sense amplifier 407. Alternatively, the voltage of the second electrode 102 may be set to a higher voltage value than that of the first electrode (preloading process). In this case, within the voltage adaptation process, not a discharging process, but a charging process of the read capacity will be carried out.

As shown in FIG. 5, the adaptation of the voltage of the bitline 406 to the voltage of the first electrode 101 varies in dependence on the resistance of the active material 103 of the resistive memory cell 100. Assuming a constant capacity for each discharging process and assuming that, at the beginning of each discharging process, the voltage at the first electrode 101 is 1.5 V, and the voltage at the second electrode 102 is 1.3 V, a first voltage adapting function 501 (resistance =10 k$\Omega$=R1), a second voltage adapting function 502 (resistance =700 k$\Omega$=R2), a third voltage adapting function 503 (resistance =4 M$\Omega$=R3), and a fourth voltage adapting function 504 (resistance =10 G$\Omega$) are obtained. Thus, it is possible to determine the memory state of the resistive memory cell 100 as soon as the corresponding voltage adapting function is known.

According to one embodiment of the present invention, the first to fourth voltage adapting functions 501 to 504 are examined by sampling the functions and processing corresponding voltage adapting function sampling values. As can be derived from FIG. 5, not each sampling time is suitable in order to distinguish between different voltage adapting functions. For example, it is easier to distinguish between the second voltage adapting function 502 and the third voltage adapting function 503 at a second sampling time $t_2$ than at a first sampling time $t_1$ or at a third sampling time $t_3$. Therefore, according to one embodiment of the present invention, the sampling process of the first to fourth voltage adapting functions 501 to 504 is carried out at time instances in which the difference between the "variable" voltage (the voltage of the second electrode represented by one of the first to fourth voltage adapting functions 501 to 504) and a reference voltage 505 is larger than a predetermined voltage threshold value.

In order to apply this principle also to the case where more than two memory states have to be distinguished (multi level memory cell), according to one embodiment of the present invention an assigning process is carried out that assigns at least one sampling time to each voltage adapting function, wherein the sampling times are chosen such that, for each voltage adapting function, the difference between the voltage adapting function and the reference voltage assigned to the voltage adapting function is larger than a predetermined voltage threshold value.

Following this rule, three sampling times are assigned in the example shown in FIG. 5 (defining four possible resistance values of the resistive memory cell), namely a first sampling time $t_1$, a second sampling time $t_2$ and a third sampling $t_3$. The first sampling time $t_1$ is suitable in order to distinguish the first voltage adapting function 501 from the second to fourth voltage adapting functions 502 to 504. The second sampling time $t_2$ is suitable in order to distinguish the first and the second voltage adapting functions 501, 502 from the third and fourth voltage adapting functions 503, 504. The third sampling time $t_3$ is suitable in order to distinguish the first to third voltage adapting functions 501 to 503 from the fourth voltage adapting function 504. In this way, it is possible to uniquely identify each of the first to fourth voltage adapting functions 501 to 504 by sampling it at the sampling times $t_1$ to $t_3$. After having identified the correct voltage adapting function, also the memory state of the resistive memory cell has been determined.

FIG. 6 shows additional voltage adapting functions corresponding to resistance values lying between 10 kΩ and 10 GΩ, for example, 10 kΩ, 100 kΩ, 500 kΩ, 7000 kΩ, 1 MΩ, 2 MΩ, 3 MΩ, 4 MΩ, 5 MΩ, 10 M Ω and 10 GΩ.

FIG. 7 shows a further embodiment 700 of the memory device according to the present invention. The architecture of the memory device 700 is very similar to the embodiment 200 shown in FIG. 2. However, instead of one single sense amplifier, first to third sense amplifiers $409_1$ to $409_3$ are provided. The first to third sense amplifiers $409_1$ to $409_3$ are connected in parallel. Each of the first to third sense amplifier $409_1$ to $409_3$ is connected via a switching element 701 to the bitline 406, and enabled by ENABLE lines $408_1$, $408_2$, and $408_1$. That is, the bitline 406 is electrically connected to the first sense amplifier $409_1$ via the first switching element $701_1$, to the second sense amplifier $409_2$ via the second switching element $701_2$, and to the third sense amplifier $409_3$ via the third switching element $701_3$. The memory device 700 shows the case where four different memory stated may be adopted by the resistive memory cell 100. According to one embodiment of the present invention, as a general rule, (n−1) sense amplifiers (SA) 409 are provided for n possible memory states.

The working principle of a memory device 700 is as follows. At the beginning of the memory state determining process, each of the first to third switching elements $701_1$ to $701_3$ is closed, i.e., each of the first to third sense amplifier $409_1$ to $409_3$ is electrically connected to the bitline 406. Then, at the first sampling time $t_1$, the first switching element $701_1$ opens, i.e., the first sense amplifier $409_1$ is electrically disconnected from the bitline (BL) 406. The voltage value of the voltage of the bitline 406 at the first sampling time $t_1$ is sampled and amplified by the first sense amplifier $409_1$. The resulting amplified sampling value is supplied to the first output terminal $407_1$ of the first sense amplifier $409_1$. In the same way, the second sense amplifier $409_2$ samples and amplifies the voltage value of the voltage of the bitline 406 at the second sampling time $t_2$, and the third sense amplifier $409_3$ samples and amplifies the voltage value of the voltage of the bitline at the third sampling time $t_3$. The amplified sampling values are supplied to the first to third output terminals DO1, DO2 and D03) $407_1$ to $407_3$ where they can be compared to a reference voltage in order to determine the memory state of the resistive memory cell 100. Alternatively, the comparison process between the sampling values and the reference voltage can be carried out within the first to third sense amplifiers $409_1$ to $409_3$. In this case, the output signals of the first to third sense amplifiers $409_1$ to $409_3$ are voltage difference signals.

FIG. 8 shows a further embodiment 800 of the memory device according to the present invention, the architecture of which being similar to the architecture of the embodiment 700 shown in FIG. 7. The only difference is that, in embodiment 800, a reference voltage supplying line 801 is connected to each of the first to third sense amplifiers $409_1$ to $409_3$ via fourth to sixth switching elements $802_1$ to $802_3$. The fourth to sixth switching elements $802_1$ to $802_3$ open and close at the same time instances as the corresponding first to third switching elements $701_1$ to $701_3$, i.e., the first switching element $701_1$ opens and closes at the same time as the fourth switching element $802_1$ (first sampling time $t_1$), for example.

According to one embodiment of the present invention, the reference voltage supplied by the reference voltage supplying line 801 is an average value between the voltage applied to the first electrode (at the beginning of the voltage adaptation process) and the voltage applied to the second electrode (at the beginning of the voltage adaptation process). The voltage of the first electrode may for example be supplied by a first bitline (BLca) 803, whereas the voltage of the second electrode may be supplied by a second bitline (BLcb) 804. The average value between the memory cell supplying voltage and the memory cell writing voltage is generated by a seventh switching element 805 connecting the first bitline 803 and the second bitline 804.

In the embodiment 800 shown in FIG. 8, the first to third sense amplifier $409_1$ to $409_3$ additionally compare the sampled voltage value against the reference voltage and supply a respective voltage difference signal to the output terminals (DO1, DO2 and DO3) $407_1$ to $407_3$. One advantage of this embodiment is that undesired voltage offsets (due to the switching elements $701_1$ to $701_3$) of the voltage to be sampled are cancelled by the voltage subtracting processes (since the reference voltage has the same offset (due to the switching elements $801_1$ to $801_3$)) carried out within the first to third sense amplifiers (SA) $409_1$ to $409_3$.

Since the capacity of the switching elements $701_1$ to $701_3$ and $801_1$ to $801_3$ is significantly lower than the capacity of the bitline 406, the capacity the sampling process, the comparing process and the amplifying process can be carried out without significantly disturbing the voltage on the bitline 406, i.e., the voltage of the second electrode 102.

FIG. 9 shows one embodiment of the method of reading data from a resistive memory cell or of writing data into a memory cell according to the present invention. In this embodiment, a possibility is described how to determine the sampling times needed when reading data from a resistive memory cell or when writing data into a resistive memory cell. In a first process P10, an initialization is carried out in which the sampling time $t_i$ is set to n ($t_i$=n), wherein n has the value "1" (which represents the earliest possible sampling time during a data reading process/data programming process). The value of n can correspond to a number of clock cycles in some embodiments. In a second process P11, data is read from a resistive memory cell with an evaluation time of $t_i$ in some embodiments. The reading operation includes the following processes:

Charging a read capacity within a reference memory cell having a memory state corresponding to a voltage adaptation function by applying a voltage between the first electrode and the second electrode of the reference memory cell, discharging the capacity via the active material of the reference memory cell, and determining the change of the voltage during the discharge of the read capacity of the reference cell by sampling the voltage at the sampling time $t_i$. Then, in a third process P 12, it is determined whether the change of the voltage, i.e., the voltage value sampled at the sampling time $t_i$ is larger than a predetermined voltage threshold value, or a read voltage is compared to a voltage reference. If this is the case, then the correct sampling time $t_i$ has already been found, and a fourth process P 13 is carried out in which the sampling time $t_i$ is defined to be n. The sampling time n is stored in a suitable way to be used in further data reading processes/data programming processes. If the voltage value sampled in the second process P11 is lower than the voltage threshold value, the sampling time is increased by one time unit, i.e., $t_i$ is defined to be (n+1) in a fifth process P14. Then, the second process P11 and the third process P12 are repeated until the "correct" sampling time $t_i$ has been found, i.e., until the voltage value sampled is higher than the predetermined voltage threshold value. As already indicated above, it is also possible to determine the change of the voltage during a charging process of the read capacity of a reference cell.

The reference memory cell may for example be a ROM memory cell being part of the memory device according to one embodiment of the present invention. Alternatively, memory cells programmed with defined procedures, for example different defined program compliance levels $l_i$ may be used.

The sampling times $t_i$ may for example be multiples of a clock cycle available on the memory device like a ring oscillator.

The algorithm shown in FIG. 9 may be performed at any time, for example during the memory test of the memory device or at defined instances.

According to one embodiment of the present invention, the algorithm shown in FIG. 9 is carried out for each voltage adaptation function that may occur when discharging the capacity of the resistive memory cell during a reading process. In this case, the first sampling time $t_1$ determined in the first process P10 may not be the earliest possible sampling time, but the sampling time determined for a voltage adaptation function corresponding to a lower memory cell resistance. As can be derived from FIG. 5, the sampling time determined for a voltage adaptation function corresponding to a higher memory resistance is older than the sampling time determined for a voltage function corresponding to a lower memory cell resistance. Thus, it is not necessary to sample the whole range of a voltage adoption function in order to determine the sampling times $t_i$.

According to one embodiment of the present invention, the program current $I_i$ may also be used to read the resistance of the memory cell and the read operation with the sampling time $t_i$ form a couple enabling the discussed multi-level voltage sensing.

FIG. 10 shows an embodiment of the method of programming a resistive memory cell according to the present invention. In a first process P20, the resistive memory cell to be programmed is erased, placing the memory cell at a high impedance state. In a second process P21, it is determined what resistance target value ($R_i$) has to be programmed, and at which sampling time $t_i$ the resistance target value should be observed. For example, $R_i$ corresponding to timing $t_i$ can be determined from among three different low impedance values if i=1,2,3. Then, in a third process, program operation P22, the resistance of the resistive memory cell is programmed using a programming current or a programming voltage. Then, in a fourth process P23, a read capacity is charged or discharged by applying a voltage between the first electrode and the second electrode of the memory cell. For example, P23 can be a multi-level read operation with read timing $t_i$, with i=1,2,3 on the programmed memory cell. The change of the voltage during the charge/discharge of the read capacity is determined by sampling the voltage adaptation function at the sampling time $t_i$. In a fifth process P24, it is determined whether the voltage sampled is larger than a predetermined voltage threshold value, or a read voltage can be compared to a reference voltage. If this is the case, the method ends in a sixth process P25 designating that the program operation is done. If this is not the case, the third process P22 is carried out again using other programming currents or programming voltages. The third to fifth processes P22 to P24 are carried out until the criteria proved in the fifth process P24 is fulfilled, i.e., until the resistance target value ($R_i$) can be observed at sampling time $t_i$.

The resistance target value $R_i$ corresponding to a sampling time $t_i$, i.e., the resistance of the resistive memory cell has to be programmed such that during a reading process the corresponding voltage adaptation function shows the resistance target value $R_i$ at the sampling time $t_i$. Then, in a third process P22, the programming of the resistance value $R_i$ is then carried out using a programming current or a programming voltage.

In the embodiment shown in FIG. 10, the sampling times $t_1$ to $t_3$ are fixed sampling times. For example, the first sampling time $t_1$ may correspond to 1n clock cycles, the second sampling time $t_2$ may correspond to 2n clock cycles, and the third sampling time may correspond to 4n clock cycles, n being an integer. However, the present invention is not restricted to these sampling times.

The embodiments shown in FIGS. 9 and 10 enable to precisely program resistance values and to precisely define sampling timing parameter using for example an oscillator (a ring counter and a clock). In order to adjust the resistance values, a program verifying algorithm is used insuring that the resistance is programmed to a resistance value which causes the reading amplifier to show the correct resistance value at the corresponding sampling timing. In order to set the timing parameter, model resistances are used. The timings are for example multiples of the ring oscillator clock cycle. The embodiment shown in FIG. 10 insures that selected timings and programmed resistance values correspond to each other and will therefore be read correctly.

In the following description, further features of exemplary embodiments of the present invention are described.

In modern high density memory devices used in the field of data storing applications (in contrast to code storing applications) the capability of storing a plurality of bits within a memory cell is very important.

In order to read several levels from a resistive memory cell, a current reading concept is usually used in which the current is kept constant over the resistance. The resulting current signal can then be processed using suitable circuits. In the case of sensitive resistive memory cells like CBRAM cells, the voltage has to be controlled to a reading voltage at a high precision in order to avoid undesired changes of the memory states. The electrical circuits used to control the reading voltage need a lot of space.

According to one embodiment of the present invention, a very small and simple voltage reading circuit is used in order to detect different levels of a memory cell (smaller and simpler than current reading circuits).

According to one embodiment of the present invention, the signal voltage is sampled at different times during a voltage reading process. The sampling values are supplied to latch comparators that compare the sampling values with a reference signal generated for this purpose. The different comparator values enable to determine the memory state of the resistive memory cell. It is important to take the effect of a voltage introduced by coupling effects during the sampling process into account. According to one embodiment of the present invention, the coupling effects are the same for the voltage signal sampled as well as for the referent voltage.

FIG. 4 shows one embodiment of a circuit arrangement according to the present invention used for reading the memory state of a memory cell by a voltage reading process. At the beginning, the capacity of the bitline BL is preloaded to a suitable value, e.g., the reading voltage $V_{read}$. Then, the capacity is discharged over the resistance of the memory cell to be read by opening the respective selecting transistor over the wordline WL. If for example the bitline loaded to 1.3 V is connected to the memory resistance, the bitline is loaded to the voltage of PL ($V_{PL}$ is 1.5 V). If the resistance is low, the loading process is carried out very fast, whereas in the case of memory cells having a high resistance, almost no voltage change can be observed within this period of time. In this way, each of the memory states can be assigned to $V_{PL}$ or $V_{read}$, respectively. An advantage of the voltage reading concept is that the voltage drop across the memory cell does not exceed $V_{PL}-V_{read}$. This voltage limitation which is essential for disturbance memory technologies like CBRAM is possible without needing an additional space consuming controlling circuit.

If the memory resistances can adapt different values (or levels), the signal develops with different speed (FIG. 5). This effect is used by some embodiments of the present invention.

Current amplifier amplify a static signal: if the voltage $V_{read}$ is controlled over the memory cell resistance R, the current $I=V_{read}/R$ remains constant. This current can be compared without problems with different reference values in a serial way. In case of a voltage reading concept this is not possible since the signal to be amplified is a transient signal. In order to enable a serial reading process, the reading process would have to be repeated for every comparing process. A circuit capable of avoiding this time consuming process is shown in FIG. 7. FIG. 7 shows a circuit in which the different sense amplifiers SA are electrically connected to the bitline by switching elements. At the beginning of the reading process, all switching elements are closed. During the discharging process of the bitline over the memory resistance, the amplifiers are successively electrically disconnected from the signal of the bitline at suitable times $t_i$ (i=1,2,3 . . . ), wherein each amplifier is decoupled at a different point of time. Each point of time at which a SA is electrically disconnected from the transient signal of the bitline enables to distinguish to state. In order to distinguish n levels (resistance values), n−1 SAs and n−1 defined points of time are needed. The points of time may for example be provided by an internal or external clock.

The reference voltage can for example be generated (FIG. 4) by loading two different complimentary bitlines currently not used BLca and BLcb with $V_{read}$ and the voltage of PL, $V_{PL}$. If both bitlines are connected, a charge equalization process can be carried out between the bitlines, wherein the reference voltage thus generated is $(V_{read}+V_{PL})/2$.

When the bitline is disconnected from the SA, a current is introduced at the input node of the SA due to capacitive effects. This coupling voltage is defined by the relationship of the coupling capacity (the gate overlay capacity of the transistors used as switching elements) and the capacity of the input node of the SA. Since the input capacity of the SA is small, the voltage introduced by coupling effects is large. To read the memory state correctly, the reference voltage has to be electrically disconnected by the analogue switching element at the same time from the additional input terminal of the sense amplifier. This can be seen in FIG. 8 for the signals at the three different SA input terminals of FIG. 8. At the time $t_1$, the first SA is separated from the reading signal and remains electrically disconnected from the reference. Although the voltage introduced by coupling effects can be higher than the actual signal difference, the signal difference between a low resistance memory cell (10 kOhm in the example) and the reference or a higher resistance memory cell (larger than 700 k Ohm in the example) and the reference is kept constant. The sampling of the reading signal at further points of time enables to distinguish between further resistances. Time $t_2$ enables, for example, to distinguish between 700 kOhm and 4M Ohm, and the sampling of the voltage at time $t_3$ enables to distinguish between 4 MOhm and 10 GOhm. This voltage difference may be evaluated using a simple comparator latch.

Since the capacity of the bitline is significantly larger than a coupling capacity, the sampling of the signal has an effect on the development of the signal that can be neglected. Therefore, the input capacity of the SA could be enlarged in order to refuse the coupling effect. This, however, would negatively influence the speed of development of the signal and would extend the reading time.

A further option is to sample the bitline signal only at predetermined points of time, wherein the switching elements remain open and are only closed for a sufficient duration at the points of time $t_i$. Since the capacity of the SA is sufficiently small, this would not have any influence on the development of the reading signals.

As used herein the terms connected and coupled are intended to include both direct and indirect connection and coupling, respectively.

In the context of this description chalcogenide material (ion conductor) is to be understood, for example, as any compound containing sulphur, selenium, germanium and/or tellurium. In accordance with one embodiment of the invention, the ion conducting material is, for example, a compound, that is made of a chalcogenide and at least one metal of the group I or group II of the periodic system, for example, arsene-trisulfide-silver. Alternatively, the chalcogenide material contains germanium-sulfide (GeS), germanium-selenide (GeSe), tungsten oxide ($WO_x$), copper sulfide (CuS) or the like. The ion conducting material may be a solid state electrolyte.

Furthermore, the ion conducting material can be made of a chalcogenide material containing metal ions, wherein the metal ions can be made of a metal, which is selected from a group consisting of silver, copper and zinc or of a combination or an alloy of these metals.

The foregoing description has been presented for purposes of illustration and description. It is not intended to be exhaustive or to limit the invention to the precise form disclosed, and obviously many modifications and variations are possible in light of the disclosed teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined solely by the claims appended hereto.

What is claimed is:

1. A memory state determining device determining a memory state of a resistive memory cell, the device comprising:
    a voltage supplying unit generating a voltage between a first electrode and a second electrode of the resistive memory cell, wherein an active material is arranged between the first electrode and the second electrode; and
    a voltage determining unit determining a voltage change occurring during a charge or a discharge of a read capacity of the resistive memory cell via the active material, the voltage change representing the memory state to be detected, wherein the voltage determining unit samples a voltage of the second electrode at a sampling time at which a difference between the voltage of the second electrode and at least one reference voltage lies above a predetermined voltage threshold value; and wherein
    each voltage adaptation function of a plurality of voltage adaptation functions is assigned to one of a plurality of possible memory states of the resistive memory cell, each voltage adaptation function reflecting a respective adjusting process of the voltage of the second electrode to the voltage of the first electrode, and
    each sampling time of a plurality of sampling times is assigned to one of the plurality of voltage adaptation functions each sampling time of the a plurality of sampling times being chosen such that a difference between each of the plurality of voltage adaptation functions and the at least one reference voltage is larger than the predetermined voltage threshold value.

2. The device according to claim 1, wherein the voltage supplying unit keeps a voltage of the first electrode constant during the charge or discharge of the read capacity.

3. The device according to claim 2, wherein the second electrode is disconnectable from the voltage supplying unit during the charge or discharge of the read capacity such that the voltage of the second electrode becomes variable and can be adapted to the voltage of the first electrode.

4. The device according to claim 3, wherein the voltage determining unit determines the voltage of the second electrode at the sampling time and compares a corresponding voltage sampling value with the at least one reference voltage in order to determine the memory state of the resistive memory cell.

5. The device according to claim 1, wherein the voltage determining unit determines at least one of the plurality of voltage adaptation functions by sampling the voltage of the second electrode at a sampling time of the plurality of sampling times assigned to the at least one of the plurality of voltage adaptation functions and by processing a corresponding sampling value.

6. The device according to claim 5, further comprising, a resistance value determining unit determining a memory state of the plurality of possible memory states of the resistive memory cell in dependence on the at least one of the plurality of voltage adaptation functions that is determined.

7. The device according to claim 6, wherein the plurality of sampling times are assigned such that each of the plurality of sampling times assigned to a voltage adaptation function of a memory state having a high resistance are older than each of the plurality of sampling times assigned to a voltage adaptation function of a memory state having a low resistance, the high resistance being higher in resistance than the low resistance.

8. The device according to claim 1, wherein the voltage determining unit comprises a sampling unit sampling the voltage of the second electrode, wherein the sampling unit is electrically connected to the second electrode via a bitline.

9. The device according to claim 8, wherein the bitline is electrically disconnectable from the sampling unit during a sampling process via a switching element.

10. The device according to claim 1, wherein the voltage determining unit comprises a plurality of sampling units connected in parallel, each of the plurality of sampling units being electrically connected to the second electrode via the bitline and sampling the voltage of the second electrode.

11. The device according to claim 10 wherein, at a beginning of the sampling process, the plurality of sampling units are electrically connected to the bitline, and wherein, at each of a plurality of sampling times, one of the plurality of sampling units is electrically disconnected from the bitline via a switching element, a last sampling unit of the plurality of sampling units which has been electrically disconnected from the bitline carrying out a current sampling process.

12. The device according to claim 9, further comprising, a supplying line supplying the sampling unit with the at least one reference voltage, the supplying line being electrically disconnectable from the sampling unit during the sampling process via a switching element.

13. The device according to claims 10, wherein the voltage determining unit comprises n−1 sampling units, wherein n is a number of possible memory states of the resistive memory cell.

14. The device according to claim 1, further comprising, a sampling time determining unit coordinating an iterative process in order to determine each sampling time of the plurality of sampling times being assigned to one of the plurality of voltage adaptation functions, the iterative process comprising:
    a) charging or discharging a read capacity within a reference memory cell, the reference memory cell being in one of the plurality of possible memory states of which corresponds to the voltage adaptation function, by applying a voltage between a first electrode and a second electrode of the reference memory cell using the voltage supplying unit; and
    b) determining a change of voltage during the charge or discharge of a reference read capacity by sampling the change of voltage at least one sampling time using the voltage determining unit,
    wherein the sampling time determining unit carries out processes a) to b) using at least one different sampling time until a voltage of the change of voltage lies within a predetermined voltage target range.

* * * * *